United States Patent
Wang et al.

(10) Patent No.: US 11,772,037 B2
(45) Date of Patent: Oct. 3, 2023

(54) METHODS FOR EXTRACTING AND RECYCLING AMMONIA FROM MOCVD PROCESS EXHAUST GAS BY FTRPSA

(71) Applicant: Zhejiang Tiancaiyunji Technology Co., Ltd., Jiaxing (CN)

(72) Inventors: Lanhai Wang, Jiaxing (CN); Yaling Zhong, Jiaxing (CN); Yun Chen, Jiaxing (CN); Jincai Tang, Jiaxing (CN); Yueming Cai, Jiaxing (CN); Yuming Zhong, Jiaxing (CN)

(73) Assignee: Zhejiang Tiancaiyunji Technology Co., Ltd., Jiaxing (CN)

( * ) Notice: Subject to any disclaimer, the term of this patent is extended or adjusted under 35 U.S.C. 154(b) by 819 days.

(21) Appl. No.: 16/423,181

(22) Filed: May 28, 2019

(65) Prior Publication Data
US 2019/0366260 A1    Dec. 5, 2019

(30) Foreign Application Priority Data
May 29, 2018    (CN) .......................... 201810526206.6

(51) Int. Cl.
*B01D 53/047*    (2006.01)
*B01D 53/00*    (2006.01)
(Continued)

(52) U.S. Cl.
CPC ........... *B01D 53/047* (2013.01); *B01D 51/10* (2013.01); *B01D 53/002* (2013.01); *B01D 53/26* (2013.01);
(Continued)

(58) Field of Classification Search
CPC .... B01D 53/047; B01D 51/10; B01D 53/002; B01D 53/0462; B01D 53/053;
(Continued)

(56) References Cited

U.S. PATENT DOCUMENTS

2018/0318750 A1    11/2018    Zhong et al.

FOREIGN PATENT DOCUMENTS

| CN | 201520645 U | * | 7/2010 | ............. C01C 1/024 |
| CN | 102626580 A | * | 8/2012 | ........... B01D 53/047 |

(Continued)

OTHER PUBLICATIONS

CN102626580A_ENG (Espacenet machine translation of He) (Year: 2012).*

(Continued)

*Primary Examiner* — Gabriel E Gitman
(74) *Attorney, Agent, or Firm* — Yiu F. Au; Au Law Office, P.C.

(57) ABSTRACT

The present invention discloses methods for extracting and recycling ammonia in MOCVD processes by FTrPSA. Through pretreatment, medium-shallow temperature PSA concentration, condensation and freezing, liquid ammonia vaporization, PSA ammonia extraction, and ammonia gas purification procedures, ammonia-containing exhaust gases from MOCVD processes are purified to meet the electronic-level ammonia gas standard required by the MOCVD processes, so as to implement recycling and reuse of the exhaust gases, where the ammonia gas yield is greater than or equal to 70-85%. The present invention solves the technical problem that atmospheric-pressure or low-pressure ammonia-containing exhaust gases in MOCVD processes cannot be returned to the MOCVD processes for use after being recycled, and fills the gap in green and circular economy development of the LED industry.

6 Claims, 4 Drawing Sheets

(51) Int. Cl.
*B01D 51/10* (2006.01)
*B01D 53/26* (2006.01)
*B01D 53/40* (2006.01)
*B01D 53/44* (2006.01)
*B01D 53/78* (2006.01)
*B01D 53/86* (2006.01)
*C01C 1/02* (2006.01)
*C01C 1/12* (2006.01)
*C23C 16/44* (2006.01)

(52) U.S. Cl.
CPC .............. *B01D 53/40* (2013.01); *B01D 53/44* (2013.01); *B01D 53/78* (2013.01); *B01D 53/8671* (2013.01); *B01D 53/8678* (2013.01); *C01C 1/024* (2013.01); *C01C 1/12* (2013.01); *B01D 2253/102* (2013.01); *B01D 2253/104* (2013.01); *B01D 2253/116* (2013.01); *B01D 2255/1023* (2013.01); *B01D 2257/104* (2013.01); *B01D 2257/108* (2013.01); *B01D 2257/406* (2013.01); *B01D 2257/708* (2013.01); *B01D 2257/80* (2013.01); *B01D 2258/0216* (2013.01); *B01D 2259/40054* (2013.01); *C23C 16/4412* (2013.01)

(58) Field of Classification Search
CPC ........ B01D 53/26; B01D 53/40; B01D 53/44; B01D 53/78; B01D 53/8671; B01D 53/8678; B01D 53/0473; B01D 53/0476; B01D 53/06; B01D 53/08; B01D 53/10; B01D 53/12; B01D 2258/0216; B01D 2259/40054; B01D 2253/102; B01D 2253/104; B01D 2253/116; B01D 2253/1023; B01D 2253/108; B01D 2253/406; B01D 2253/708; B01D 2253/80; C01C 1/003; C01C 1/024; C01C 1/12; C23C 16/4412; C23C 16/45593; C23C 16/4402; C01B 3/56; Y02C 20/20; Y02P 20/50

See application file for complete search history.

(56) References Cited

FOREIGN PATENT DOCUMENTS

CN    102728159 A  * 10/2012   ............... B01D 3/14
CN    105749699 A  *  7/2016   ......... B01D 53/0462

OTHER PUBLICATIONS

CN105749699A_ENG (Espacenet machine translation of Zhong) (Year: 2016).*
CN201520645U_ENG (Espacenet machine translation of Ding) (Year: 2010).*
CN102728159A_ENG (Espacenet machine translation of Tang) (Year: 2012).*

* cited by examiner

ABSTRACT
METHODS FOR EXTRACTING AND RECYCLING AMMONIA FROM MOCVD PROCESS EXHAUST GAS BY FTRPSA

CROSS REFERENCE OF RELATED APPLICATION

This application claims priority under 35 U.S.C. 119 to China Patent Application No. CN201810526206.6, filed May 29, 2018.

BACKGROUND OF THE PRESENT INVENTION

Field of Invention

The present invention relates to the field of electronic environmental protection for preparing a process ammonia gas (NH3) and recycling NH3 from an exhaust gas in a semiconductor Light Emitting Diode (LED) manufacturing process, and in particular, to methods for extracting and recycling an ammonia gas from a MOCVD (Metal-Organic Chemical Vapor Deposition) process exhaust gas by FTrPSA (Full Temperature Range-Pressure Swing Adsorption).

Description of Related Arts

A MOCVD process (equipment), as a modern method and means for conducting research and production of compound semiconductor materials, in particular as a method and equipment for industrial production of novel light-emitting materials, i.e., LEDs, is irreplaceable by other semiconductor material growing methods and equipment due to its high quality, high stability, high repeatability, and large-scale property, and becomes a main method and means for producing photoelectric device materials and microwave device materials in today's world. In addition to LEDs, lasers, detectors, efficient solar cells, photoelectric cathodes and the like may also be involved, so that the MOCVD process (equipment) is an indispensable method and equipment in the photo-electronic industry. For example, blue and violet LEDs which are widely applied in the market are all produced by using gallium nitride (GaN)-based materials. In an MOCVD epitaxy process, a high-purity Metal Oxide (MO) is used as an MO source, for example, tri-methyl gallium (TMGa), and carried by electronic-level carrier hydrogen (H2, having a purity greater than 99.99999% (7N)) and nitrogen (N2, having a purity greater than 99.99999% (7N)) to enter an MOCVD reaction kettle together with an electronic-level ammonia gas (NH3), and over a sapphire (Al2O3) substrate heated to an appropriate temperature, the gas-state metal oxide TMGa is controlled to be delivered to the surface of the sapphire substrate for growing a semiconductor thin-film epitaxial material GaN having specific components, a specific thickness, and specific electrical and optical parameters. In order to ensure complete reaction in an MOCVD reaction chamber, H2, N2, and NH3 are all provided in an excessive amount, so that an MOCVD tail gas having a large amount of H2, N2, and NH3 is generated. A typical LED GaN MOCVD epitaxial tail gas consists of: N2: 60% (v/v, the same below); H2: 25%; NH3: 14%; and the balance being metal ions, particles, methane (CH4), oxygen (O2), and oxides such as carbon monoxide (CO), carbon dioxide (CO2), and water (H2O).

Because an MOCVD process tail gas in LED preparation contains impurities such as highly corrosive NH3, flammable and explosive H2, metal ions, arsine (AsH3), oxides, and other impurities, it is quite difficult to purify and recycle NH3 and return same to the LED manufacturing process. At present, most LED chip manufacturers or wafer fab. remove or convert corrosive NH3 into ammonia water, ammonia fertilizer or the like for recycling in various ways such as washing, catalytic conversion, adsorption, and rectification, and the NH3 used in the MOCVD process still needs to be supplied by special gas companies. The tail gas in which the ammonia is removed has a low concentration of H2 and contains a large amount of N2, so that the tail gas is further treated, for example, by means of catalytic combustion or acid and alkali treatment to remove harmful and toxic impurity components, and then enters a hydrogen emission system or is directly exhausted to the air.

The main existing methods for recycling NH3 from an ammonia-containing waste gas include, for example, a freezing method, a water washing method (washing), a sulfuric acid absorption method, a method coupling phosphoric acid (ammonium) absorption and rectification, an organic solvent absorption method, an adsorption method (mainly TSA), a method coupling adsorption and rectification, a catalytic combustion method, and a catalytic ammonia decomposition method.

The most commonly used ammonia gas recycling method at home and aboard is the water washing method (washing), which is applicable to treatment of an ammonia-containing waste gas having relatively simple components, for example, the ammonia-containing waste gas in the MOCVD process. At a certain temperature (usually a low temperature) and pressure, water is used as a detergent (solvent) for absorbing the ammonia in the MOCVD process waste gas, thereby forming the ammonia water having a concentration of 20-25%. Although the absorption can be conducted in stages to achieve a high absorption efficiency, after the waste ammonia gas is absorbed and formed into industrial ammonia water, the ammonia gas in the waste gas cannot be recycled and purified to return to the MOCVD process. The LED manufacturers or wafer fab. still need to purchase white ammonia or ultra-high ammonia gas on an expensive price. The ammonia recycling by means of water absorption is merely one of the treatment methods for making the LED process waste gas satisfy the emission standards, and the byproduct, i.e., the industrial ammonia water, is comprehensive used for ammonia recycling.

The freezing method is suitable for treatment of an ammonia-containing waste gas having relatively simple components, including the MOCVD process ammonia-containing waste gas. In this method, there is no need to introduce a medium (a solvent, an absorbent, or the like), and the ammonia is recycled by condensing and freezing the ammonia gas component in the waste gas into a liquid at a low temperature based on the physical property that the ammonia component can easily be liquefied, where other non-condensable gas (components having low boiling points) may escape. The method is able to directly recycle the ammonia in the waste gas, and after refining processing, the ammonia can be made into a raw material for an electronic-level ammonia gas; however, because the content of the ammonia gas in the feed gas is relatively low, the power consumption of directly using the freezing method is high, and there are lots of impurity components which have high boiling points or may easily be liquefied in the produced liquid ammonia, so that the ammonia cannot be directly used as a raw material for electronic-level ammonia gas preparation.

The sulfuric acid absorption method is suitable for treatment of an ammonia-containing tail gas having relatively complex components, for example, synthesis ammonia, coke-oven gas, and other tail gases. The equipment investment and maintenance costs are relatively high, and the recycled ammonia gas is made into an ammonium sulfate byproduct as a fertilizer or chemical product, so that the ammonia gas cannot be directly used.

The method coupling phosphoric acid (ammonium) absorption and rectification is applicable to a complex working condition of an ammonia-containing tail gas requiring large throughput, for example, coke oven gas. The USS phosam apparatus (direct or indirect methods) of the U.S. has high absorption selectivity, high desorption and rectification pressure, high energy consumption, and high equipment investment and maintenance costs; 99.98% industrial ammonia can be obtained, the yield is 90%, and the industrial ammonia can be used as a raw material for preparation of electronic-level ammonia gas.

In the organic solvent absorption method, an organic solvent such as liquid hydrocarbon can be used as the absorbent or solvent to selectively absorb ammonia in a waste gas at a certain temperature and pressure, the solubility of the ammonia in the organic solvent is improved, and by recycling the ammonia gas after desorbing and enabling the ammonia gas to escape, the absorbent or solvent can be recycled. The method is applicable to a working condition where VOCs and hydrocarbon components are included and the ammonia content is relatively low, and as for the purification treatment, the investment is high, the purification degree is high, but the purity of the recycled ammonia gas is low and needs further treatment.

The adsorption method, mainly the Temperature Swing Adsorption (TSA) method, is suitable for an ammonia-containing waste gas having simple components, for example, the MOCVD tail gas. The method is simple: activated carbon is usually used as the adsorbent, and the adsorption capacity is greater than 0.5 kg ammonia gas/kg adsorbent. For TSA operations, the yield of the ammonia gas is 90%, but the regeneration temperature is high, operations are complex, energy consumption is high, the service life of the adsorbent is short, and the purity of the ammonia gas is low (Max. 98%). Therefore, the TSA method is usually used in removal and purification of a simple waste gas having a relatively low ammonia concentration. The adsorption method is applied in liquid ammonia dehydration and refining because the polarity of water is higher than that of ammonia, so that the efficiency of removing a trace amount of water from the ammonia by using the adsorption method is relatively high.

For other methods, the catalytic combustion method, for example, uses catalytic combustion to implement high temperature catalytic oxidation on combustible components such as ammonia, hydrogen, and methane in the tail gas, and exhaust the tail gas after the tail gas is further treated to reach the standard, so that the ammonia gas cannot be recycled and reused; the catalytic ammonia decomposition method relates to performing catalytic ammonia decomposition on the tail gas having a relatively high ammonia concentration at a high temperature to obtain H2 and N2, and then the H2 and the N2 are recycled after being treated, so that the ammonia likewise cannot be recycled and reused.

In a series of existing ultra-pure ammonia preparation methods, i.e., preparing the electronic-level ammonia gas having a purity of 99.999% or more by using 99.95% industrial anhydrous ammonia as a raw material, the adsorption method, the rectification method, the method coupling adsorption and rectification, the chemical catalysis method (dehydration), and a metal getter method can be coupled with the ultra-pure ammonia preparation methods, but the ammonia-containing waste gas still cannot be directly recycled and reused.

SUMMARY OF THE PRESENT INVENTION

The present invention provides a method for extracting and recycling ammonia from MOCVD processes exhaust gas by Full Temperature Range-Pressure Swing Adsorption (FTrPSA), that is a method based on Pressure Swing Adsorption (PSA) and capable of being coupled with various separation techniques. On the basis of differences in adsorption separation coefficients and physicochemical properties of different components of a material under different pressures and temperatures, by using an easy-to-match and easy-to-balance cyclic operation of adsorption and desorption in a normal temperature/medium temperature (medium-normal temperature) or shallow condensing/medium temperature (medium-shallow temperature) PSA process, the required effective component NH3 (having a purity greater than or equal to 99.999%) is separated and purified, and on the basis of physiochemical characteristics, relative separation coefficients, corresponding separation and purification methods, and corresponding operating conditions (temperature and pressure) of the multiple components (mainly H2, NH3, N2, methane (CH4), carbon monoxide (CO), carbon dioxide (CO2), oxygen (02), water (H2O), silane (SiH4), and the like) in the electronic-level waste gas generated in the LED-MOCVD process, different conventional physical adsorption and chemical adsorption methods are coupled to implement ammonia (NH3) extraction, recycling, and reuse from the MOCVD process waste gas by FTrPSA. For this purpose, the present invention adopts the following technical solution to recycle NH3 from a tail gas and return the NH3 to the MOCVD process for use, thereby implementing recycling and reuse of the NH3:

a method for extracting and recycling ammonia from a MOCVD process exhaust gas by FTrPSA, including the following steps, (1) preparing a feed gas, wherein the feed gas being an exhaust gas in a manufacturing process for an LED based on gallium nitride epitaxial wafer growth which is prepared by MOCVD at atmospheric pressure or a lower pressure, the feed gas mainly consisting of nitrogen (N2), hydrogen (H2), and ammonia (NH3), as well as a small quantity of metal ions, particles, arsine, methane (CH4), water (H2O), carbon monoxide (CO), carbon dioxide (CO2), and oxygen (O2), and other impurity components of the exhaust gas in a manufacturing process for an LED, the pressure being at atmospheric pressure or a lower pressure and a temperature of 20-140° C.;

(2) executing a pretreatment procedure, the feed gas is introduced into a pretreatment unit consisting of a dust remover, a particle removing filter, and an oil mist removing catcher, to remove dust, particles, oil mist and other impurities in sequence under operating conditions at the pressure of 0.2-0.3 MPa and the temperature of 20-140° C., and proceeding to a next procedure, which is a medium-shallow temperature PSA concentration procedure;

(3) executing a medium-shallow temperature PSA concentration procedure, wherein the feed gas from the pretreatment procedure is compressed to 0.3-4.0 MPa, passed into a multi-tower PSA concentration procedure performed by a multi-tower PSA concentration unit consisting of at least four adsorption towers with an operating pressure of 0.3-4.0 MPa and an operating temperature of 20-140° C., at least one adsorption tower is in an adsorption step, the remaining adsorption tower(s) are in a desorption and regeneration step, and a non-adsorbed phase gas is formed and exhausted to be an adsorption exhaust gas, which is introduced into a hydrogen extraction process, or is treated by means of catalytic combustion, or is sprayed, or other methods to meet the atmospheric control standards for discharge to the atmosphere; a formed adsorbed phase gas is an ammonia-rich concentrated gas to be introduced to a next procedure, which is a condensation and freezing procedure, by means of blowing or pressurization; an adsorbent used in the medium-shallow temperature PSA concentration procedure is one or more combinations of activated aluminum oxide, silica gel, activated carbon and a molecular sieve; and a regeneration mode is used during desorption by a method of vacuum pumping, or a method of purging, or a method of combining vacuum pumping and purging;

(4) executing a condensation and freezing procedure, by means of blowing or pressurization, the ammonia-rich concentrated gas from the medium-shallow temperature PSA concentration procedure is introduced to a condensation and freezing procedure performed by a condensation and freezing unit consisting of a condenser, an evaporator condenser and a freezer to form liquid ammonia having an ammonia concentration greater than or equal to 98-99%, and the liquid ammonia is introduced into a next procedure, which is an ammonia vaporization procedure, wherein a non-condensable gas produced in the condensation and freezing procedure is mixed with the feed gas for further ammonia recycling, or is mixed with the adsorption exhaust gas in the medium-shallow temperature PSA concentration procedure, or is introduced to the hydrogen extraction process, or is treated by means of catalytic combustion, or is sprayed, or other methods to meet the atmospheric control standards for discharge to the atmosphere;

(5) executing a liquid ammonia vaporization procedure, the liquid ammonia from the condensation and freezing procedure is introduced directly to a liquid ammonia vaporization procedure for vaporization, the liquid ammonia vaporization procedure is performed by a liquid ammonia vaporization unit consisting of a liquid ammonia evaporator and an ammonia gas buffer tank to form an ammonia gas having an ammonia concentration greater than or equal to 98-99% (industrial ammonia), and the ammonia gas is passed into a next procedure, which is an ammonia gas purification procedure;

(6) executing a PSA ammonia extraction procedure, the industrial ammonia from the liquid ammonia vaporization procedure is introduced directly to a multi-tower PSA ammonia gas purification procedure performed by a multi-tower PSA ammonia gas purification unit consisting of at least four adsorption towers with an operating pressure of 0.6-2.0 MPa and an operating temperature of 60-120° C., at least one adsorption tower is in the adsorption step, the remaining adsorption tower(s) are in the a desorption and regeneration step to form a non-adsorbed phase gas that is an ultra-pure ammonia gas with a purity greater than or equal to 99.995%, and passed into a next procedure, which is an ammonia gas purification procedure, wherein a method of combining vacuum pumping and purging is adopted in a desorption and regeneration mode, the formed desorbed gas is directly exhausted to a waste steam treatment system outside the area for treatment, and an adsorbent used in the PSA ammonia extraction procedure is one or more combinations of activated aluminum oxide, silica gel, activated carbon and a molecular sieve; and (7) executing an ammonia gas purification procedure, the ultra-pure ammonia gas from the PSA ammonia extraction procedure is passed through an intermediate product storage tank, or directly be subjected to heat exchange, under a temperature of 60-500° C., the ultra-pure ammonia gas directly or by a reducing valve is decompressed to a pressure meeting the requirement of the LED-MOCVD manufacturing process, and is introduced to an ammonia gas purification procedure performed by an ammonia gas purification unit consisting of a metal getter purifier, or an adsorbent purifier with a metal oxide active component, or an ammonia gas purifier with an adsorbent and a metal getter;

wherein the ultra-pure ammonia gas is purified to remove trace impurities to obtain a final electronic-level ammonia gas product at an operating temperature of 60-500° C. and an operating pressure ranging from atmospheric pressure to a pressure condition meeting requirement of the ammonia gas in the MOCVD manufacturing process;

wherein a purity of the final electronic-level ammonia gas product satisfies an electronic-level ammonia gas (white ammonia) product standard specified by the state or the Semiconductor Equipment and Materials International (SEMI), and the purity of final electronic-level ammonia gas product is greater than or equal to level 7-8N, wherein the final electronic-level ammonia gas product is subjected to temperature reduction by means of heat exchange, or decompression, or be introduced into an electronic-level ammonia gas product storage tank for storage, or be passed through an ammonia gas product buffer tank to directly return to a step in the MOCVD process in which an ammonia gas is used;

wherein the operating temperature of the ammonia gas purification procedure is determined by the metal getter or adsorbent and a regeneration step is unnecessary when a service life of the metal getter or adsorbent is at least greater than two years, the yield of the obtained electronic-level ammonia gas product is greater than 70-86%.

Furthermore, according to the method for extracting and recycling ammonia from an MOCVD process exhaust gas by FTrPSA, the feed gas includes a waste gas or a tail gas containing main components such as hydrogen, nitrogen, and ammonia gas and other impurity components of the waste gas or tail gas generated in other semiconductor processes for a light emitting diode.

Furthermore, according to the method for extracting and recycling ammonia from an MOCVD process exhaust gas by FTrPSA, wherein in the pretreatment procedure, if the feed gas contains high concentrations of other impurity components of the exhaust gas, a dust remover, a particle removing filter, an oil mist removing catcher, a caustic scrubber, a neutralizing tower, a dryer and the like are additionally provided to remove acidic and volatile organic matters (VOCs) and other impurity components of the exhaust gas that may have a greater impact on operations in the medium-shallow temperature PSA concentration procedure.

Furthermore, according to the method for extracting and recycling ammonia from an MOCVD process exhaust gas by FTrPSA, in the medium-shallow temperature PSA concentration and adsorption tower desorption adsorption steps, after the adsorption tower desorption step ends and before a pressure equalizing dropping or normal flowing control of the desorption and regeneration step starts, the ultra-pure ammonia gas from the PSA ammonia extraction procedure is used for replacement, for improving the yield of the ammonia gas in this procedure to be 80-90% or higher.

Furthermore, according to the method for extracting and recycling ammonia from an MOCVD process exhaust gas by FTrPSA, in the medium-shallow temperature PSA concentration, the feed gas from the pretreatment procedure is fed to the medium-shallow temperature PSA concentration by the blower without being compressed; the procedure is composed of two stages of PSA systems; that is, the feed gas from the pretreatment procedure is pressurized to 0.2-0.3 MPa by the blower and is introduced into the bottom of a first PSA adsorption tower (first-stage PSA), the non-adsorbed phase adsorption exhaust gas flows out of a top of the adsorption tower of the first-stage PSA, and the exhaust gas is introduced into the hydrogen extraction process, or is treated by means of catalytic combustion, or is sprayed, or other methods to meet the atmospheric control standards for discharge to atmosphere; the desorbed gas desorbed (reverse flowing, purging, or vacuum pumping) at and flowing out of a bottom of the adsorption tower of the first-stage PSA is fed to the bottom of a second PSA adsorption tower (second-stage PSA) by means of the blower, a non-adsorbed phase mixed intermediate gas flows out of a top of the adsorption tower of the second-stage PSA and is introduced back as a first-stage PSA feed gas for further recycling ammonia, and the ammonia-rich concentrated gas flows out of a bottom of the adsorption tower of the second-stage PSA to be introduced into the next procedure, which is the condensation and freezing procedure, by means of blowing or pressurization, wherein after the adsorption step ends and before the pressure equalizing dropping or normal flowing control of the desorption and regeneration step starts, a replacement step is added in the second PSA adsorption tower (second-stage PSA), in which the ultra-pure ammonia gas from the PSA ammonia extraction procedure is used as a replacement gas, for improving the yield of the ammonia gas in this procedure to be 80-90% or higher.

Furthermore, according to the method for extracting and recycling ammonia from an MOCVD process exhaust gas by FTrPSA, in the medium-shallow temperature PSA concentration procedure, the feed gas from the pretreatment procedure is pressurized to 0.3-4.0 MPa and then fed to the medium-shallow temperature PSA concentration procedure constituted by two stages of PSA; the feed gas is introduced from the bottom of the first PSA adsorption tower (first-stage PSA), and a non-adsorbed phase intermediate gas flows out of the top of the adsorption tower of the first-stage PSA; a part of the non-adsorbed phase intermediate gas serves as a feed gas to be introduced into the bottom of the second PSA adsorption tower (second-stage PSA), and the other part serves as the adsorption waste gas, which is introduced into a hydrogen extraction process, or is treated by means of catalytic combustion, or is sprayed, or other methods to meet the atmospheric control standards for discharge to the atmosphere; the desorbed gas (the ammonia-rich concentrated gas) desorbed (reverse flowing, purging, or vacuum pumping) at a bottom of the adsorption tower of the first-stage PSA and then flows out of the bottom of the adsorption tower of the first-stage PSA to be fed to the subsequent procedure, which is the condensation and freezing procedure, by means of the blower;

Or the feed gas from the pretreatment procedure is pressurized to 0.3-4.0 MPa and then mixed with a part of the intermediate gas flowing out of the top of the adsorption tower of the first-stage PSA as a feed gas to be introduced into the second PSA adsorption tower (second-stage PSA), and then is fed into the bottom of the adsorption tower of the second-stage PSA, and the non-adsorbed phase intermediate gas flows out of the top of the adsorption tower of the second-stage PSA; a part of the non-adsorbed phase intermediate gas serves as the feed gas to be introduced into the bottom of the first PSA adsorption tower (first-stage PSA), and the other part serves as the adsorption waste gas, which is introduced into a hydrogen extraction process, or is treated by means of catalytic combustion, or is sprayed, or other methods to meet atmospheric control standards for discharge to atmosphere;

Or the desorbed gas (the ammonia-rich concentrated gas is desorbed (reverse flowing, purging, or vacuum pumping) at and flowing out of a bottom of the adsorption tower of second-stage PSA and mixed with the desorbed gas (the ammonia-rich concentrated gas) which is desorbed at and flowing out of the bottom of the adsorption tower of the first-stage PSA, and then fed to the subsequent procedure, which is the condensation and freezing procedure, by means of the blower;

wherein after the adsorption step ends and before the pressure equalizing dropping or normal flowing control of the desorption and regeneration step starts, a replacement step is added in the first and the second PSA adsorption towers, in which the ultra-pure ammonia gas from the PSA ammonia extraction procedure is used as a replacement gas, for improving the yield of the ammonia gas in this procedure to be 80-90% or higher, or the desorbed gas (the ammonia-rich concentrated gas) flowing from this procedure is used as the replacement gas after being compressed, for improving the yield of the ammonia gas in this procedure to be 80-90% or higher.

Furthermore, according to the method for extracting and recycling ammonia from an MOCVD process exhaust gas by FTrPSA, an ammonia gas rectification procedure is used to replace the condensation and freezing procedure, the ammonia-rich concentrated gas from the medium-shallow temperature PSA concentration procedure is introduced to the condenser by means of blowing or pressurization to form the liquid ammonia, and then is introduced to the ammonia liquid rectification procedure; the ammonia gas flows out of the top of a rectification tower, and a part of the ammonia gas is introduced back to the condenser for reflux; the non-condensable gas escapes from the condenser, and is introduced back to the raw gas, or is mixed with the adsorption waste gas flowing out of the medium-shallow temperature PSA concentration procedure, or is introduced into a hydrogen extraction process, or is treated by means of catalytic combustion, or is sprayed, or other methods to meet the atmospheric control standards for discharge to atmosphere; a part of the ammonia has a concentration greater than or equal to 99%, and directly is introduced to the subsequent procedure, which is the PSA ammonia extraction procedure, to omit the liquid ammonia vaporization procedure, wherein an operating temperature of the ammonia liquid rectification procedure is 70-140° C. and an operating pressure is 0.3-2.0 MPa; and wherein an impurity component having a boiling point higher than that of the ammonia, for example, water, hydrocarbon and the like, flows out of the bottom of the rectification tower and is fed outside the area for treatment.

Furthermore, according to the method for extracting and recycling ammonia from an MOCVD process exhaust gas by FTrPSA, the feed gas of the PSA ammonia extraction procedure, the ammonia gas from the liquid ammonia vaporization or the ammonia gas from rectification procedure is added with metal palladium as a catalytic de-aerator for removing oxygen in a working condition containing a small amount of oxygen, wherein the operating temperature is 70-90° C., and the depth reaches 0.1 ppm or lower; and the oxygen-removed ammonia gas is introduced to the next procedure, which is PSA ammonia extraction.

Furthermore, according to the method for extracting and recycling ammonia from an MOCVD process exhaust gas by FTrPSA, the liquid ammonia formed in the condensation and freezing procedure has an ammonia concentration greater than or equal to 98-99% and directly is introduced to a liquid phase adsorption procedure; wherein a temperature ranges from −40° C. to 40° C. and a pressure ranges from the atmospheric pressure to 4.0 MPa, the liquid ammonia is introduced to the tower top, a Temperature-PSA (TPSA) zone consisting of two or three towers, and is subjected to liquid phase adsorption at the adsorption temperature ranging from −40° C. to 40° C. and at the adsorption pressure ranging from the atmospheric pressure to 4.0 MPa; wherein a small amount of water and other adsorption impurity components are adsorbed by the adsorbent with which the adsorption tower is filled; the ammonia, as the non-adsorbed phase which is non-adsorbable, is made into the liquid ammonia having a purity of 99.999% and flows out of the bottom of the adsorption tower as a product output, which is subjected to bottled or canned pressurized vaporization and then fed to ammonia gas purification; the adsorbed small amount of water and other adsorption impurity components serve as the adsorbed phase, and are subjected to regeneration of a thermal regeneration carrier gas (steam or nitrogen) and desorption by rinsing at the atmospheric pressure or by vacuum pumping and rinsing, and then exhausted from the top of the adsorption tower; when one adsorption tower allows the liquid ammonia having the purity of 99.999% to flow out after the adsorption ends, another adsorption tower is introduced to the liquid phase adsorption procedure again after thermal regeneration and desorption, thereby achieving a continuous cyclic adsorption operation; when three towers are working, one tower performs adsorption, one performs regeneration, and the remaining one stands by or performs regeneration.

Furthermore, according to the method for extracting and recycling ammonia from an MOCVD process exhaust gas by FTrPSA, in the medium-shallow temperature PSA concentration procedure and the PSA ammonia extraction procedure, under an operating condition that the adsorption pressure is greater than or equal to 0.6 MPa, slow and uniform control is implemented on pressure changes in a cyclic operation process of adsorption and desorption by means of a program control valve and a regulating valve on pipelines connected between the adsorption towers, so as to prevent beds of the adsorption towers from being scoured by airflow caused by an excessive pressure change of the system, or prevent the occurrence of adsorbent pulverization, thereby keeping system operations in this procedure stable and secure.

The present invention includes the following beneficial effects:

(1) according to the present invention, NH3 can be extracted from the MOCVD process waste gas and returned to the MOCVD process for use, solving the problems such as high energy consumption, low purity of a recycled material, or the recycled material being other products that cannot be returned to the MOCVD process in existing removal, purification, or ammonia and ammoniate recycling methods such as washing, freezing, sulfuric acid absorption, a method coupling phosphoric acid (ammonium) absorption and rectification, catalytic combustion, and catalytic decomposition, thereby realizing the recycling and reuse of all components of the waste gas, reducing the emission of the waste gas, and making up for the gap of the LED process exhaust gas treatment technology;

(2) according to the present invention, on the basis of physicochemical and relative separation coefficient characteristics at the medium-low temperature (20-140° C.) and under the medium-lower pressure (0.3-4.0 MPa), the adsorbed phase NH3 is selectively separated and recycled, thereby avoiding the technical difficulties that NH3 with strong polarity is deeply adsorbed during the adsorption cyclic operation and is difficult to be regenerated and it is difficult to use conventional TSA and PSA techniques to process highly corrosive NH3 components, which makes it difficult to realize the adsorption and regeneration cyclic operations of the medium-low temperature FTrPSA system based on coupling of adsorption, condensation and freezing, vaporization or rectification, absorption, separation techniques in the present invention; finally, an electronic-level ammonia gas product is obtained, and the technical bottleneck of a difficulty in recycling NH3 and returning same to the MOCVD process for reuse in conventional adsorption and separation processes is overcome;

(3) according to the present invention, in the process of realizing recycling and reuse of NH3, the MOCVD process and no oxygen-containing compound to which the NH3 is sensitive, especially H2O, is brought to the system, so that the entire recycling and reuse process is stable and the impact on the quality of LED chips is reduced to zero;

(4) according to the present invention, in the process of purifying, recycling, and reusing waste gas at atmospheric pressure or low pressure, pressurized treatment or non-pressurized treatment is used according to use conditions of the process (electronic-level) ammonia gas to obtain an electronic-level ammonia gas product;

(5) according to the present invention, a medium-shallow temperature PSA concentration procedure is used, which can not only avoid deep adsorption of the adsorbed phase NH3, but also relieve the strong corrosive problem of high-concentration ammonia in the adsorption towers due to excessively long adsorption or desorption time;

(6) according to the present invention, on the basis of differences in operating temperature between different procedures, by arranging a reasonable heat exchange system, the heat of the entire operating system can be fully used;

(7) according to the present invention, different procedures, including process simplification, switching between ammonia product forms (liquid and gas), and the like, can be flexibly recombined according to actual working conditions of a user; and (8) the present invention solves the greatest difficulty in recycling ammonia-containing MOCVD process waste gas: the NH3 purification, recycling and reusing process is not only limited by different original front-end pretreatment processes of the MOCVD tail gas and but also subject to different fixed rear-end purification procedures, so that the requirements on the NH3 purification, recycling and reusing process for the tail gas between the front-end pretreatment and the rear-end purification are more strict.

DETAILED DESCRIPTION OF THE PREFERRED EMBODIMENT

In order to make a person skilled in the art better understand the present invention, the technical solutions in the embodiments of the present invention are clearly and fully described below with reference to the accompanying drawings in the embodiments of the present invention.

Figure 1:
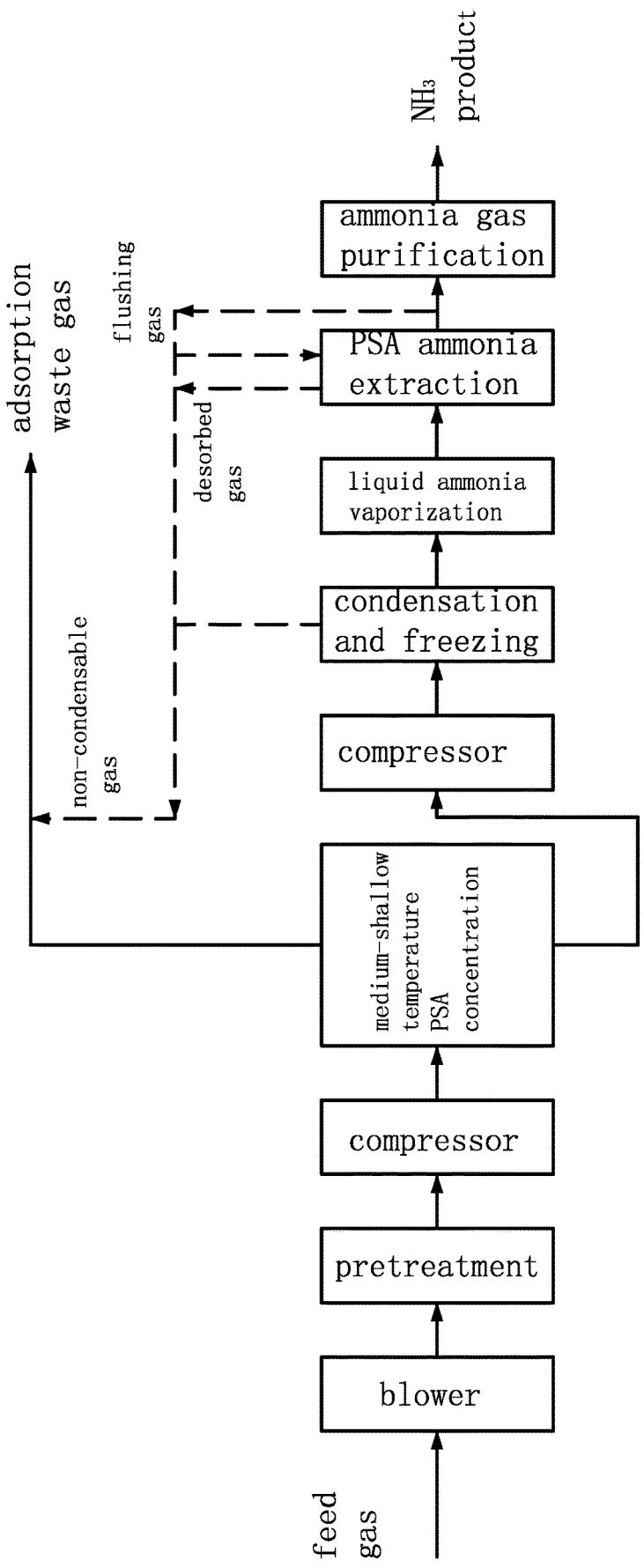
FIG. 1 is a schematic flowchart of embodiment 1 of the present invention.

As shown in FIG. 1, a method for extracting and recycling ammonia from a MOCVD process exhaust gas by FTrPSA includes the following specific implementation steps:

(1) a raw gas, the raw gas being an exhaust gas in a manufacturing process for an LED based on gallium nitride epitaxial wafer growth which is prepared by MOCVD at atmospheric pressure or a lower pressure, the feed gas from the raw gas mainly consisting of 46% (v/v, the same below) of nitrogen (N2), 34% of hydrogen (H2), and 19% of ammonia (NH3), and the remaining 1% being a small quantity of metal ions, particles, arsine, methane (CH4), water (H2O), carbon monoxide (CO), carbon dioxide (CO2), and oxygen (O2), and other impurity components, the pressure being atmospheric pressure or low pressure, and the temperature being 50-70° C.;

(2) executing a pretreatment, the feed gas is introduced into a pretreatment unit consisting of a dust remover, a particle removing filter, and an oil mist removing catcher, removing dust, particles, oil mist and other impurities in sequence under operating conditions at the pressure of 0.2-0.3 MPa and the temperature of 50-70° C., and proceeding to a next procedure, which is a medium-shallow temperature PSA concentration procedure;

(3) executing a medium-shallow temperature PSA concentration, the feed gas from the pretreatment procedure is compressed to 1.6 MPa, passed into a multi-tower PSA concentration procedure performed by a multi-tower PSA concentration unit consisting of six adsorption towers with an operating pressure of 1.6 MPa and an operating temperature of 50-70° C., a desorption tower performs adsorption step, a pressure equalizing control for twice and a normal flowing control for once, and then a desorption and regeneration step is performed by vacuum pumping and purging, to form a non-adsorbed phase gas, wherein the non-adsorbed phase gas is an adsorption exhaust gas, which has an NH3 concentration controlled to be below or equal to 0.5% and is treated by means of catalytic combustion and is sprayed to meet the atmospheric control standards for discharge to atmosphere; a formed adsorbed phase gas is an ammonia-rich concentrated gas, which has an ammonia concentration of 65% and is compressed to 0.6 MPa and then is introduced to a next procedure, which is a condensation and freezing procedure; an adsorbent used in the medium-shallow temperature PSA concentration procedure is a composite combination of activated aluminum oxide, silica gel, activated carbon and a molecular sieve;

(4) executing a condensation and freezing, the ammonia-rich concentrated gas from the medium-shallow temperature PSA concentration procedure is compressed to 0.5-0.6 MPa, and introduced into a condensation and freezing procedure performed by condensation and freezing unit consisting of a condenser, an evaporator condenser and a freezer to form liquid ammonia having an ammonia concentration greater than or equal to 98-99%, and the liquid ammonia is introduced into a next procedure, which is an ammonia vaporization procedure, wherein a non-condensable gas produced in the condensation and freezing procedure is mixed with the adsorption exhaust gas in the medium-shallow temperature PSA concentration procedure, and then is treated by means of catalytic combustion and is sprayed to meet atmospheric control standards for discharge to the atmosphere;

(5) executing a liquid ammonia vaporization, the liquid ammonia from the condensation and freezing procedure is introduced directly into a liquid ammonia vaporization procedure for vaporization, the liquid ammonia vaporization procedure is performed by a liquid ammonia vaporization unit consisting of a liquid ammonia evaporator and an ammonia gas buffer tank to form an ammonia gas having an ammonia concentration greater than or equal to 98-99% (industrial ammonia), and the ammonia gas is introduced into a next procedure, which is an ammonia gas purification procedure;

(6) executing a PSA ammonia extraction, the industrial ammonia from the liquid ammonia vaporization procedure is introduced directly to a multi-tower PSA ammonia gas purification procedure performed by a multi-tower PSA ammonia gas purification unit consisting of six adsorption towers with an operating pressure of 0.5-0.6 MPa and an operating temperature of 50-70° C., one adsorption tower performs adsorption step and a desorption and regeneration step, a pressure equalizing dropping control and a normal flowing control is employed in the desorption and regeneration step by vacuum pumping and purging to form a non-adsorbed phase gas; the non-adsorbed phase gas is an ultra-pure ammonia gas with a purity greater than or equal to 99.995%, and the ultra-pure ammonia gas is passed into a next procedure, which is an ammonia gas purification procedure, wherein the formed desorbed gas is directly exhausted to a waste steam treatment system outside the area for treatment, and an adsorbent used in the PSA ammonia extraction procedure is a composite combination of activated aluminum oxide, silica gel, activated carbon and a molecular sieve; and (7) executing an ammonia gas purification, the ultra-pure ammonia gas from the PSA ammonia extraction procedure is passed through an intermediate product storage tank, then heated to 300-400° C. by means of heat exchange to adjust a pressure of the ultra-pure ammonia gas to meet a pressure requirement of the ammonia gas used in an LED MOCVD process, at a pressure of which of 0.3 MPa in the present embodiment, and then is introduced into an ammonia gas purification procedure performed by an ammonia gas purification unit consisting of a metal getter purifier, wherein the ultra-pure ammonia gas is purified to remove trace impurities to obtain a final electronic-level ammonia gas product at an operating temperature of 300-400° C. and under an operating pressure of 0.3 MPa, wherein a purity of the final electronic-level ammonia gas product satisfies an electronic-level ammonia gas (white ammonia) product standard specified by the state or the SEMI, the purity of the final electronic-level ammonia gas product is greater than or equal to 99.99999-99.999999% (level 7-8N), and then the temperature of the final electronic-level ammonia gas product is reduced to the normal temperature by means of heat exchange, and I then the final electronic-level ammonia gas product is introduced into an electronic-level ammonia gas product storage tank for storage, or the final electronic-level ammonia gas product is introduced into the MOCVD process according to the requirements on the ammonia gas in use during the process, wherein an operating temperature of the ammonia gas purification procedure is determined by the metal getter, a high-temperature metal getter is used in the present embodiment, and a regeneration step is unnecessary when a service life of the metal getter is at least greater than two years at a temperature of 300-400° C.; in this way, the yield of the obtained electronic-level ammonia gas product is greater than 70-86%.

Embodiment 2

As shown in FIG. 1, on the basis of embodiment 1, under a condition the feed gas is at the temperature of below 20-30° C. and other conditions are not changed, heat exchange is performed between the high temperature product gas generated in the ammonia gas purification procedure and the raw gas, and after the temperature is recovered to 50-70° C., operations are carried out as specified in embodiment 1. The purpose is to prevent a high concentration of ammonia in the feed gas from escaping at a temperature lower than the ambient temperature 20° C. and becoming a liquid, which may damage the equipment in the pretreatment procedure.

Embodiment 3

As shown in FIG. 1, on the basis of embodiment 1, under a condition the feed gas is at the temperature of below 100-120° C. and other conditions are not changed, the operations in embodiment 1 are directly and normally carried out, wherein the pretreated feed gas is pressurized to 3.0 MPa, the operating pressure of the medium-shallow temperature PSA concentration procedure is 3.0 MPa, and the operating temperature is 100-120° C.; the adsorption waste gas from the medium-shallow temperature PSA concentration procedure and the non-condensable gas from the condensation and freezing procedure are mixed and first fed to a spraying step for recycling some ammonia water, then enter catalytic combustion and spraying treatment to meet atmospheric control standards for discharge to atmosphere; the ammonia-rich concentrated gas from the medium-shallow temperature PSA concentration procedure is introduced to the condensation and freezing procedure.

Embodiment 4

As shown in FIG. 1, on the basis of embodiment 1, during the medium-shallow temperature PSA concentration, in the adsorption tower desorption step, after the adsorption tower adsorption step ends and before the pressure equalizing dropping or normal flowing control of the desorption and regeneration step starts, the ultra-pure ammonia gas from the PSA ammonia extraction procedure is used for replacement, for improving the yield of the ammonia gas in this procedure to be 80-90% or higher.

Embodiment 5

Figure 2:
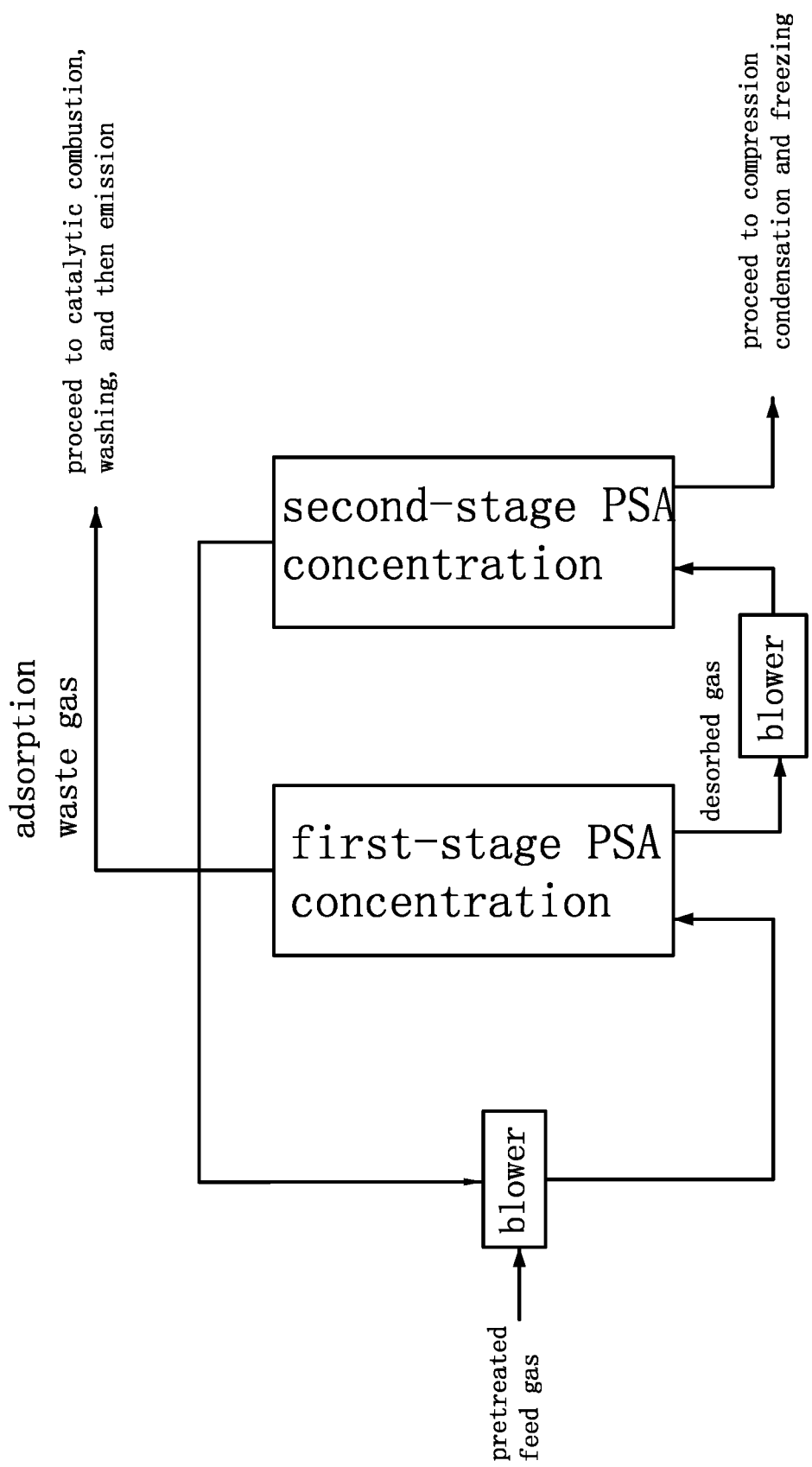
FIG. 2 is a schematic flowchart of embodiment 5 of the present invention.

As shown in FIG. 2, on the basis of embodiment 1, in the medium-shallow temperature PSA concentration, the feed gas from the pretreatment procedure is fed to the medium-shallow temperature PSA concentration by the blower without being compressed; the procedure is composed of two stages of PSA systems; that is, the feed gas from the pretreatment procedure is pressurized to 0.2-0.3 MPa by the blower and is introduced to from the bottom of a first PSA adsorption tower (first-stage PSA), the non-adsorbed phase adsorption exhaust gas flows out of a top of the adsorption tower of the first-stage PSA, where the NH3 concentration is controlled to be lower than or equal to 0.5%, and the exhaust gas is treated by means of catalytic combustion and spraying to meet atmospheric control standards for discharge to atmosphere; the desorbed gas desorbed (reverse flowing, purging, or vacuum pumping) at and flowing out of a bottom of the adsorption tower of the first-stage PSA is fed to the bottom of a second PSA adsorption tower (second-stage PSA) by means of the blower, a non-adsorbed phase mixed intermediate gas flows out of a top of the adsorption tower of the second-stage PSA and returns as a first-stage PSA feed gas for further recycling ammonia, and the ammonia-rich concentrated gas having a concentration higher than or equal to 65-70% and flowing out of a second-stage PSA tower bottom is introduced to the next procedure, which is the condensation and freezing procedure, by means of blowing or pressurization, where after the adsorption step ends and before the pressure equalizing dropping or normal flowing control of the desorption and regeneration step starts, a replacement step is added in the second PSA adsorption tower (second-stage PSA), in which the ultra-pure ammonia gas from the PSA ammonia extraction procedure is used as a replacement gas, for improving the yield of the ammonia gas in this procedure to be 80-90% or higher.

Embodiment 6

Figure 3:
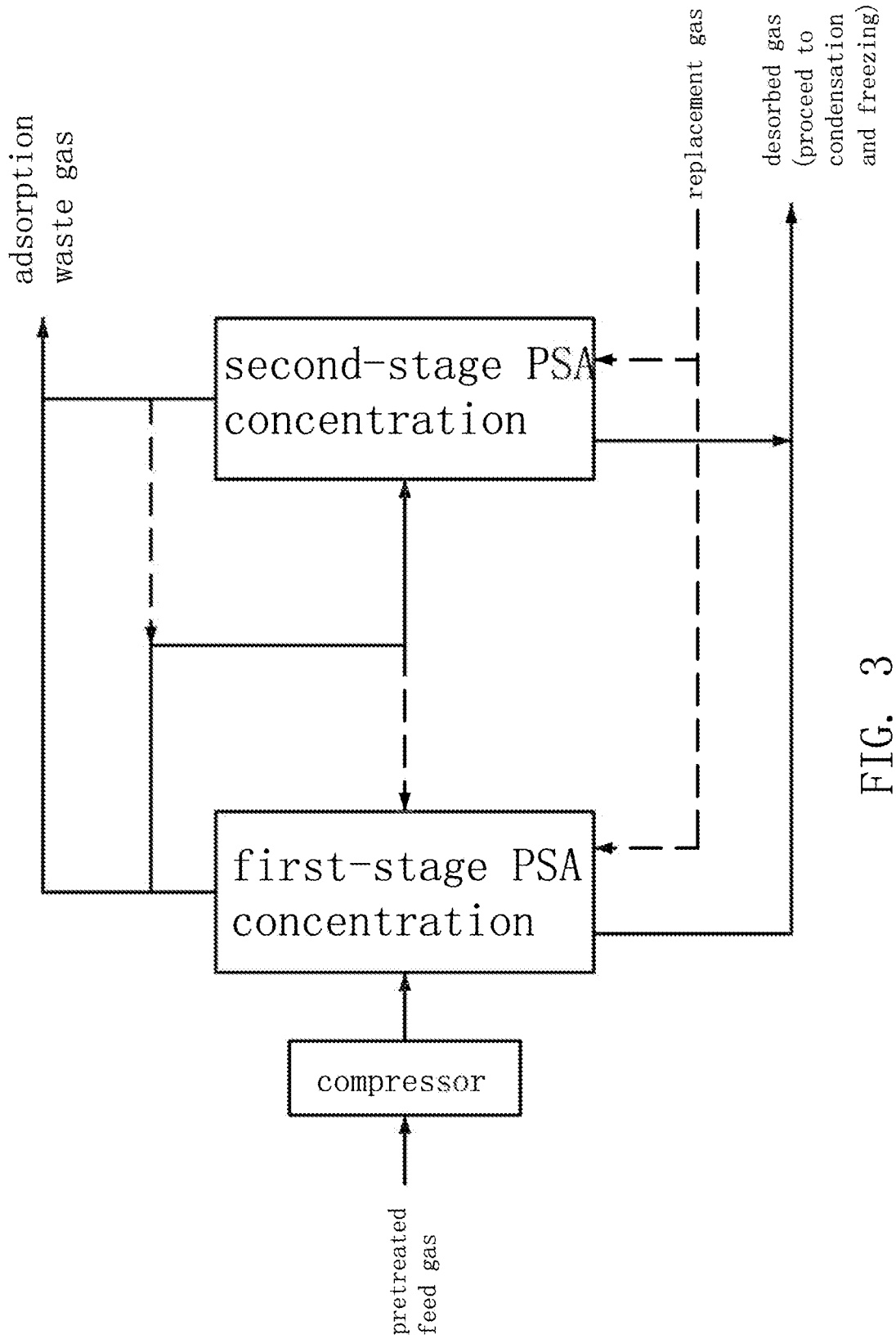
FIG. 3 is a schematic flowchart of embodiment 6 of the present invention.

As shown in FIG. 3, on the basis of embodiment 1, in the medium-shallow temperature PSA concentration, the feed gas from the pretreatment procedure is pressurized to 1.6 MPa and then mixed with some intermediate gas flowing out of the top of the adsorption tower of the first-stage PSA; the mixture serves as the feed gas to the second PSA adsorption tower (second-stage PSA) and is fed from the tower bottom; the non-adsorbed phase intermediate gas flows out of the top of the adsorption tower of the second-stage PSA, a part of the non-adsorbed phase intermediate gas serves as a feed gas to the bottom of the first-stage PSA adsorption tower, and the other part serves as the adsorption waste gas, which is treated by means of catalytic combustion and spraying to meet atmospheric control standards for discharge to atmosphere; the desorbed gas (the ammonia-rich concentrated gas) desorbed (reverse flowing, purging, or vacuum pumping) at and flowing out of the second-stage PSA tower bottom is mixed with the desorbed gas (the ammonia-rich concentrated gas) desorbed at and flowing out of the bottom of the adsorption tower of the first-stage PSA and the mixture is fed to the next procedure, which is the condensation and freezing procedure, by means of the blower, where after the adsorption step ends and before the pressure equalizing dropping control or normal flowing control starts, a replacement step is added in the first and the second PSA adsorption towers, in which the desorbed gas (the ammonia-rich concentrated gas) flowing from the present procedure is pressurized and then used as a replacement gas, for improving the yield of the ammonia gas in this procedure to be 80-90% or higher.

Embodiment 7

Figure 4:
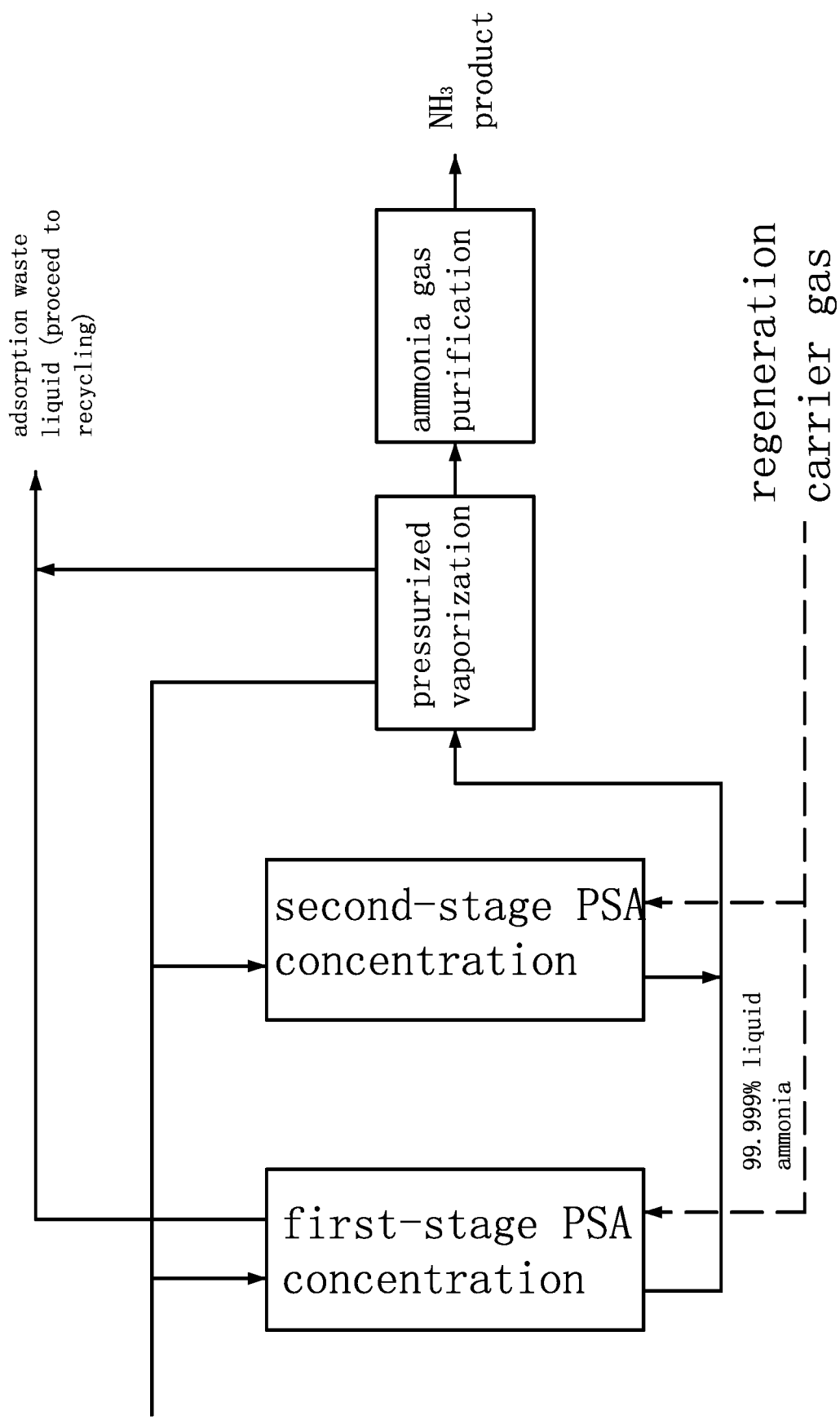
FIG. 4 is a schematic flowchart of embodiment 7 of the present invention.

As shown in FIG. 4, on the basis of embodiment 1, the liquid ammonia formed in the condensation and freezing procedure has an ammonia concentration greater than or equal to 98-99% and directly is introduced to the liquid phase adsorption procedure; under a temperature ranging from −40° C. to 40° C. and a pressure of 0.6-1.6 MPa, the liquid ammonia is introduced to the tower top, a TPSA zone consisting of two towers, and is subjected to liquid phase adsorption at the adsorption temperature ranging from −40° C. to 40° C. and at the adsorption pressure of 0.6-1.6 MPa;

a small amount of water and other adsorption impurity components serve as adsorbates and are adsorbed by the adsorbent with which the adsorption tower is filled; the ammonia, as the non-adsorbed phase which is non-adsorbable, is made into the liquid ammonia having a purity of 99.999%, and flows out of the bottom of the adsorption tower as a product output, which is subjected to canned pressurized vaporization and then fed to ammonia gas purification; the adsorbed small amount of water and other adsorption impurity components serve as the adsorbed phase, are subjected to regeneration of a thermal regeneration carrier gas (steam) and desorption by vacuum pumping and purging, and then exhausted from the top of the adsorption tower; one adsorption tower allows the liquid ammonia having the purity of 99.999% to flow out after the adsorption ends, and the other adsorption tower is introduced to the liquid phase adsorption procedure again after thermal regeneration and desorption, thereby achieving a continuous cyclic adsorption operation.

Obviously, the above-mentioned embodiment is only part of the embodiment in the present invention rather than the whole embodiment. Based on the embodiment recorded in the present invention, with respect to all other embodiments obtained by those skilled in the art without paying creative work, or the structural changes made under the scope of the present invention, all technical solution that are identical or similar to the present invention fall into the protection scope of the present invention.

What is claimed is:

1. A method for extracting and recycling ammonia from an MOCVD (Metalorganic Chemical Vapor Deposition) process exhaust gas by FTrPSA (full temperature range-pressure swing adsorption), comprising the following procedures:
    (a) providing a feed gas comprising ammonia, wherein the feed gas is an exhaust gas in an MOCVD manufacturing process for a light emitting diode based on gallium nitride epitaxial wafer growth, the feed gas being at atmospheric pressure or a lower pressure and a temperature of 20-140° C.;
    (b) executing a pretreatment procedure, wherein the feed gas is introduced into a pretreatment unit to remove dust, particles, oil mist and other impurities in sequence to form a pretreated feed gas under operating conditions at a pressure of 0.2-0.3 MPa and a temperature of 20-140° C.;
    (c) executing a medium-shallow temperature PSA (pressure swing adsorption) concentration procedure, wherein the pretreated feed gas from the pretreatment procedure is compressed to 0.3-4.0 MPa, passed into a multi-tower PSA concentration unit with an operating pressure of 1.0-4.0 MPa and an operating temperature of 20-140° C., wherein at least one adsorption tower of the multi-tower PSA concentration unit performs an adsorption step to form an adsorbed phase gas that is an ammonia-rich concentrated gas, wherein remaining adsorption tower(s) of the multi-tower PSA concentration unit are in a desorption and regeneration step;
    (d) executing the desorption and regeneration step on the adsorbed ammonia-rich concentrated gas to form a desorbed ammonia-rich concentrated gas, and executing a condensation and freezing procedure on the desorbed ammonia-rich concentrated gas, wherein the desorbed ammonia-rich concentrated gas is introduced into a condensation and freezing unit to form liquid ammonia;
    (e) executing a liquid ammonia vaporization procedure, wherein the liquid ammonia is introduced into a liquid ammonia vaporization unit to form an industrial ammonia gas;
    (f) executing a PSA ammonia extraction procedure, wherein the industrial ammonia gas from the liquid ammonia vaporization procedure is introduced into at least one adsorption tower of a multi-tower PSA ammonia gas purification unit during an adsorption step with an operating pressure of 0.6-2.0 MPa and an operating temperature of 60-120° C., wherein remaining adsorption tower(s) of the multi-tower PSA ammonia gas purification unit are in a desorption and regeneration step, to form a non-adsorbed phase gas that is an ultra-pure ammonia gas;
    (g) executing an ammonia gas purification procedure, wherein the ultra-pure ammonia gas is decompressed to be introduced to an ammonia gas purification unit to remove trace impurities to obtain a final electronic-level ammonia gas product.

2. The method for extracting and recycling ammonia from an MOCVD process exhaust gas by FTrPSA according to claim 1, wherein the exhaust gas consists of nitrogen, hydrogen, and ammonia, as well as metal ions, particles, arsine, methane, water, carbon monoxide, carbon dioxide, oxygen and other impurity components.

3. The method for extracting and recycling ammonia from an MOCVD process exhaust gas by FTrPSA according to claim 1, wherein the pretreatment unit comprises a dust remover, a particle removing filter and an oil mist removing catcher.

4. The method for extracting and recycling ammonia from an MOCVD process exhaust gas by FTrPSA according to claim 1, wherein during the medium-shallow temperature PSA concentration procedure, a non-adsorbed phase gas is formed in the at least one adsorption tower of the multi-tower PSA concentration unit in the adsorption step, and
    wherein the non-adsorbed phase gas is discharged to form an adsorption waste gas, and the adsorption waste gas is introduced into a hydrogen extraction process, or is treated by means of catalytic combustion, or is sprayed to meet the atmospheric control standards for discharge to the atmosphere.

5. The method for extracting and recycling ammonia from an MOCVD process exhaust gas by FTrPSA according to claim 1, wherein an adsorbent used in the medium-shallow temperature PSA concentration procedure is one or a combination of activated aluminum oxide, silica gel, activated carbon and a molecular sieve.

6. The method for extracting and recycling ammonia from an MOCVD process exhaust gas by FTrPSA according to claim 1, wherein during the PSA ammonia extraction procedure, vacuum pumping and purging are adopted in the desorption and regeneration step, and an adsorbent used in the PSA ammonia extraction procedure is one or a combination of activated aluminum oxide, silica gel, activated carbon, and a molecular sieve.

* * * * *